(12) United States Patent
Nuebling

(10) Patent No.: US 11,489,522 B2
(45) Date of Patent: Nov. 1, 2022

(54) CIRCUIT ARRANGEMENT WITH GALVANIC ISOLATION

(71) Applicant: Infineon Technologies AG, Neubiberg (DE)

(72) Inventor: Marcus Nuebling, Olching-Esting (DE)

(73) Assignee: Infineon Technologies AG, Neubiberg (DE)

( * ) Notice: Subject to any disclaimer, the term of this patent is extended or adjusted under 35 U.S.C. 154(b) by 2 days.

(21) Appl. No.: 17/143,922

(22) Filed: Jan. 7, 2021

(65) Prior Publication Data

US 2021/0265994 A1    Aug. 26, 2021

(30) Foreign Application Priority Data

Feb. 25, 2020    (DE) .......................... 102020104869.6

(51) Int. Cl.
*H03K 17/689*    (2006.01)
*H01F 38/14*    (2006.01)

(52) U.S. Cl.
CPC .......... *H03K 17/689* (2013.01); *H01F 38/14* (2013.01); *H01F 2038/143* (2013.01)

(58) Field of Classification Search
CPC ........................... H01F 38/14; H01F 2038/143
See application file for complete search history.

(56) References Cited

U.S. PATENT DOCUMENTS

| 4,167,682 | A | * | 9/1979 | O'Dea | ................. | H03K 5/1252 327/28 |
| 6,654,462 | B1 | | 11/2003 | Hedberg | | |
| 6,927,662 | B2 | | 8/2005 | Kahlmann et al. | | |
| 10,236,878 | B1 | | 3/2019 | Chen et al. | | |
| 2008/0080624 | A1 | * | 4/2008 | Feldtkeller | ............... | H04B 3/02 375/244 |
| 2008/0311862 | A1 | | 12/2008 | Spina et al. | | |
| 2014/0125386 | A1 | | 5/2014 | Tajima et al. | | |
| 2018/0062678 | A1 | * | 3/2018 | Ragonese | ........... | H03F 3/45632 |

FOREIGN PATENT DOCUMENTS

| DE | 10232642 A1 | 2/2004 |
| EP | 2282405 A2 | 2/2011 |

OTHER PUBLICATIONS

Office Action, in the German language, from counterpart German Application No. 102020104869.6, dated Sep. 28, 2020, 9 pp.

* cited by examiner

*Primary Examiner* — Daniel Kessie
(74) *Attorney, Agent, or Firm* — Shumaker & Sieffert, P.A.

(57) ABSTRACT

A circuit arrangement comprises: a primary coil and a secondary coil, which are inductively coupled, but galvanically isolated from one another; a first voltage divider which is connected between a first terminal and a second terminal of the secondary coil and which has a center tap connected to a ground node; a second voltage divider, which is connected between the first terminal and the second terminal of the secondary coil; and an active circuit, which is connected to the first terminal and the second terminal of the secondary coil, a center tap of the second voltage divider and to the ground node. The active circuit is configured to provide a current path between the first terminal of the secondary coil and the ground node and between the second terminal of the secondary coil and the ground node depending on a voltage at the center tap of the second voltage divider.

20 Claims, 3 Drawing Sheets

CIRCUIT ARRANGEMENT WITH GALVANIC ISOLATION

This Application claims priority to German Application Number 102020104869.6 filed on Feb. 25, 2020, the entire content of which is incorporated herein by reference.

TECHNICAL FIELD

The present description relates to the field of integrated circuits having integrated coreless transformers for galvanic isolation of electronic circuits.

BACKGROUND

There are a multiplicity of applications requiring galvanic isolation. One example is semiconductor switches (e.g. IGBTs for use in inverters) with integrated driver electronics including one or more integrated coreless transformers in order to galvanically isolate the semiconductor switch from the control logic contained in the driver electronics. In this case, control signals are transmitted from the control logic to the driver circuit via a coreless transformer. The driver circuit switches the semiconductor switch on and off according to the received control signals. The signal transmission via integrated coreless transformers is known per se, and products in which integrated cureless transformers are used for galvanic isolation are commercially available.

One parameter that may be relevant to the performance of such products is the so-called. CTMI value (CTMI=Common Mode Transient Immunity), The CTMI value represents the maximum tolerable rate of change of a common mode voltage (e.g. in volts per nanosecond) between two galvanically isolated circuits. Said common mode voltage can be observed e.g. between the ground nodes of two galvanically isolated circuits.

With the introduction of silicon carbide components, the switching frequencies have become higher, for example in inverter applications, and the requirements made of the driver electronics with regard to CTMI are increasing as a consequence. Known approaches for achieving a high CTMI value include the use of coreless transformers with fully differential signal transmission. Since coreless transformers are integrated in the metallization layers of a semiconductor chip, coupled coils with center tapping (which are necessary for differential operating) cannot easily be produced. In practice, a coil with center tapping is produced by two series-connected partial coils being arranged next to one another in a metallization layer. That has the consequence that four partial coils are required for a coreless transformer, two series-connected coils on the primary side and two corresponding series-connected coils on the secondary side of the coreless transformer. This approach enables a high CTMI, but results in a very high consumption of chip areas since differential transmission requires double the number of coils required for a "normal" coreless transformer with non-differential "single-ended" transmission.

In view of the explanations above, an object of the present invention can be considered that of providing a circuit arrangement having a coreless transformer, which circuit arrangement has a comparatively high CTMI value and at the same time requires a comparatively small chip area.

SUMMARY

The object mentioned above is achieved by means of the circuit arrangement according to claim 1 and the method according to claim 15. The dependent claims relate to various embodiments and further developments.

A circuit arrangement with galvanic isolation is described below. In accordance with one exemplary embodiment, the circuit arrangement comprises the following: a primary coil and a secondary coil, which are inductively coupled, but galvanically isolated from one another; a first voltage divider which is connected between a first terminal and a second terminal of the secondary coil and which has a center tap connected to a ground node; a second voltage divider, which is connected between the first terminal and the second terminal of the secondary coil; and an active circuit, which is connected to the first terminal and the second terminal of the secondary coil, a center tap of the second voltage divider and to the ground node. The active circuit is configured to provide a current path between the first terminal of the secondary coil and the ground node and between the second terminal of the secondary coil and the ground node depending on a voltage at the center tap of the second voltage divider Furthermore, a description is given of a method for transmitting differential signals via a coreless transformer having a primary coil and a secondary coil, wherein a voltage divider is connected between a first terminal and a second terminal of the secondary coil and a center tap of the voltage divider is connected to a ground node. In accordance with one exemplary embodiment, the method comprises generating a control voltage, which is dependent on a common mode voltage at the first terminal and the second terminal of the secondary coil, and activating a current path between the first terminal of the secondary coil and the ground node by driving a first transistor with the control voltage, wherein a load current path of the first transistor couples the first terminal of the secondary coil to the ground node. The method further comprises activating a current path between the second terminal of the secondary coil and the ground node by driving a second transistor with the control voltage, wherein a load current path of the second transistor couples the second terminal of the secondary coil to the ground node.

BRIEF DESCRIPTION OF THE DRAWINGS

Exemplary embodiments are explained in greater detail below with reference to drawings. The illustrations are not necessarily true to scale and the exemplary embodiments are not restricted only to the aspects illustrated. Rather, importance is attached to illustrating the principles underlying the exemplary embodiments. With respect to the drawings.

ROI

DETAILED DESCRIPTION

Figure 1:
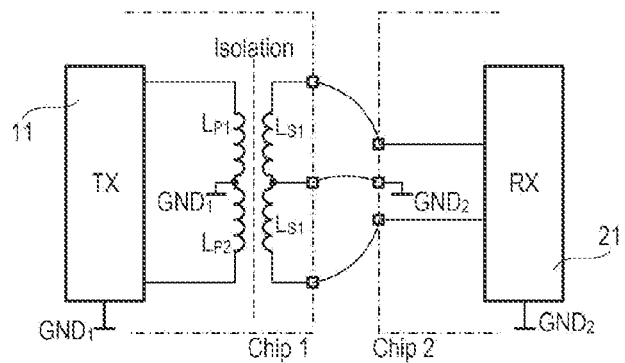
FIG. 1 illustrates one example of a circuit arrangement having a coreless transformer suitable for differential signal transmission. Primary coil and secondary coil of the coreless transformer are in each case two series-connected partial coils.

FIG. 1 illustrates one example of a circuit arrangement having a coreless transformer suitable for differential signal transmission. Primary coil and secondary coil of the coreless transformer are in each case two series-connected partial coils $L_{P1}$ and $L_{P2}$ (primary side) and $L_{S1}$ and $L_{S2}$ (secondary side). The circuit node lying between the two partial coils $L_{P1}$ and $L_{P2}$, is connected to a first ground node $GND_1$, and the circuit node lying between the two partial coils $L_{S1}$ and $L_{S2}$ is connected to a second ground node $GND_2$. The first ground node $GNB_1$ is galvanically isolated from the second ground node $GND_2$, i.e. the associated ground potentials can vary relative to one another. The voltage between the first ground node $GNB_1$ and the second ground node $GND_2$ is the common mode voltage mentioned in the introduction, which can change relatively rapidly, depending on the application (e.g. hundreds of volts per nanosecond).

The transmitter circuit 11 is coupled to the primary coil (partial coils $L_{P1}$ and $L_{P2}$), and the receiver circuit 21 is coupled to the secondary coil (partial coils $L_{S1}$ and $L_{S2}$). The transmitter circuit 11 is configured to transmit signals via the coreless transformer formed by the primary coil and secondary coil, and the receiver circuit 21 is configured to receive the transmitted signals. The transmitter circuit 11 operates in a first voltage domain with the ground potential at the ground node $GND_1$ and the receiver circuit 21 operates in a second voltage domain with the ground potential at the ground node $GND_2$. In the example illustrated, the transmitter circuit 11 and the coreless transformer are integrated in a first semiconductor chip 1, whereas the receiver circuit 21 is integrated in a second semiconductor chip 2. The second semiconductor chip 2 is connected to the secondary coil of the coreless transformer e.g. by means of bond wires. The center tappings of the primary and secondary coils connected to the respective ground nodes allow a balanced construction of the circuit arrangement and fully differential signal transmission via the coreless transformer, Both semiconductor chips 1, 2 can be contained in the same chip package.

Figure 2:
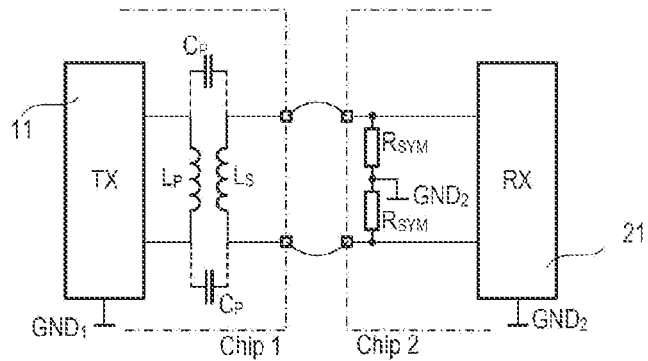
FIG. 2 illustrates one example of a circuit arrangement having a coreless transformer constructed from two coupled coils without center tapping. The secondary coil is connected to a voltage divider with center tapping.

As mentioned in the introduction, the balanced design of the circuit arrangement from FIG. 1 results in a high consumption of chip area. The example from FIG. 2 is a circuit arrangement having a coreless transformer constructed from two coupled coils (primary coil $L_P$ and secondary coil $L_S$) without center tapping. As in the previous example, the coreless transformer couples a transmitter circuit 11 and a receiver circuit 21, which are integrated in different semiconductor chips. In this regard, reference is made to the description above. The secondary side of the coreless transformer is balanced by a voltage divider that has two identical resistors $R_{sym}$ being connected in parallel with the secondary coil $L_S$. The center tapping of the voltage divider is connected to the ground node $GND_2$ of the second voltage domain. The receiver circuit thus "sees" a differential signal in relation to the potential of the ground node $GND_2$.

In practice, however, the circuit from FIG. 2 functions only if the resistors $R_{sym}$ of the voltage divider have relatively small resistances. In the case of resistors $R_{sym}$ having excessively large resistances, situations can occur in which the maximum permissible input voltage range at the input of the receiver circuit 21 would be exceeded. The primary and secondary coils of the integrated coreless transformer are inductively coupled, but also have a capacitive coupling on account of the production technique. Said capacitive coupling is represented by the parasitic capacitors $C_P$ coupling the primary coil and the secondary coil. A change in the common mode voltage between the ground nodes $GND_1$ and $GND_2$ gives rise to a displacement current through the capacitors $C_P$. On the secondary side, said displacement current flows through the resistors $R_{sym}$ to the ground node $GND_2$ and causes a corresponding voltage drop in the resistors, which voltage drop can be of a magnitude such that it runs outside the permissible input voltage range of the receiver circuit 21, lithe resistors $R_{sym}$ are chosen to have comparatively small resistances, however, that reduces the amplitude of the differential signals transmitted via the transformer, as a result of which the reliability of the transmission is reduced.

The example from fig thus enables—theoretically—differential signal transmission with a simple coreless transformer without center tapping at the primary and secondary coils), but the design of the resistors $R_{sym}$ poses significant problems in practice. The approach described below makes it possible to choose the resistors $R_{sym}$ with comparative large resistances, and nevertheless to maintain compliance with the permissible input voltage range of the receiver circuit 21.

Figure 3:
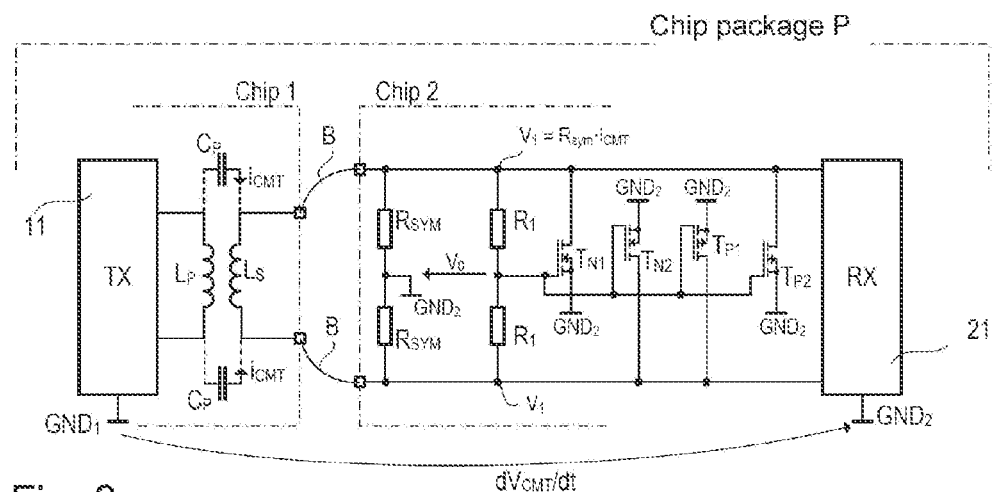
FIG. 3 illustrates a further example of a circuit arrangement having a coreless transformer constructed from two coupled coils without center tapping. The secondary coil is coupled to an active circuit, which carries away undesired displacement currents.

FIG. 3 illustrates a further example of a circuit arrangement having a coreless transformer constructed from two coupled coils without center tapping. The example from FIG. 3 is substantially identical to the example from FIG. 2, but comprises an additional active circuit, which is coupled to the secondary coil $L_S$. Said active circuit actively reacts to the abovementioned displacement currents and carries them away via a temporary current path of low resistance. As in FIG. 2, the transmitter circuit 11 and the coreless transformer can be integrated in a first chip 1 and the receiver circuit 21 can be integrated in a second chip 2. Both chips 1, 2 can be arranged in the same chip package P and can be connected by means of bond wires B.

As mentioned, a change $dV_{CMT}/dt$ in the voltage between the ground nodes $GND_1$ and $GND_2$ results in a displacement current $i_{CTM}$ through the parasitic capacitors $C_P$. As an illustrative example, $C_P=0.1$ pF and $dV_{CMT}/dt=200$ V/ns is assumed. With these numbers, a displacement current $i_{CTM}=20$ mA is obtained. It is evident that even relatively small resistances of a few hundred Ω at the receiver circuit 21 result in relatively high input voltages which cannot be processed by the receiver circuit 21 with a typical supply voltage of 1.5 V.

The active circuit coupled to the secondary coil $L_S$ solves the problem discussed above by virtue of the fact that depending on a voltage at the center tap of a further voltage divider, between a first terminal of the secondary coil $L_S$ and the ground node $GND_2$ and, during the second terminal of the secondary coil $L_S$ and the ground node $GND_2$, a current path is temporarily provided in order to carry away the displacement current $i_{CTM}$. The further voltage divider mentioned is constructed in a balanced manner in relation to its center tap; it consists of a series circuit comprising two identical resistors $R_1$, $R_1$, which is connected between the first terminal of the secondary coil $L_S$ and the second terminal of the secondary coil $L_S$.

In the example illustrated in FIG. 3, the active circuit comprises a first transistor $T_{N1}$ and a second transistor $T_{N2}$. The first transistor $T_{N1}$ has a load current path connecting the first terminal of the secondary coil $L_S$ and the ground node $GND_2$, and the second transistor $T_{N2}$ has a load current path connecting the second terminal of the secondary coil $L_S$ and the ground node $GND_2$. The control electrode of the first transistor $T_{N1}$ and the control electrode of the second transistor $T_{N2}$ are coupled to the center tap of the second voltage divider $R_1$. In other words, the center tap of the further voltage divider $R_1$; $R_1$ provides a control voltage $V_0$ for the transistors $T_{N1}$ and $T_{N2}$, which is dependent on a common mode voltage $V_1=R_{sym}·i_{CTM}$ at the first terminal and the second terminal of the secondary coil $L_S$. However, a differential signal that is transmitted via the coreless transformer does not change the control voltage $V_0$.

The transistors $T_{N1}$ and $T_{N2}$ are activated as a reaction to a falling electrical potential of the ground node $GND_2$ (relative to the electrical potential of the ground node $GND_1$). In this case, the rate of change $dV_{CMT}/dt$ and the resulting displacement current $i_{CTM}$ are positive, which results in a positive control voltage $V_0$ suitable for switching the transistors $T_{N1}$ and $T_{N2}$ on. In the present example, the transistors $T_{N1}$ and $T_{N2}$ are embodied as N-channel MOS transistors. In order to achieve a good performance, it is desirable that the two transistors $T_{N1}$ and $T_{N2}$ have as far as possible identical characteristics (characteristic curves) and have identical electrical behavior.

In order to be able to react to negative rates of change $dV_{CMT}/dt$ as well, the active circuit can furthermore comprise a third transistor $T_{P1}$ and a fourth transistor $T_{P2}$. The third transistor $T_{P1}$ has a load current path connecting the first terminal of the secondary coil $L_S$ and the ground node $GND_2$, and the fourth transistor $T_{P2}$ has a load current path connecting the second terminal of the secondary coil $L_S$ and the ground node $GND_2$. The control electrode of the third transistor $T_{P1}$ and the control electrode of the fourth transistor $T_{P2}$ are likewise coupled to the center tap of the second voltage divider $R_1$. The third and fourth transistors $T_{P1}$, $T_{P2}$ are of a transistor type that is complementary to the type of the first and second transistors $T_{N1}$, $T_{N2}$. In the present example, the transistors $T_{P1}$ and $T_{P2}$ are embodied as p-channel MOS transistors. The two transistors $T_{P1}$ and $T_{P2}$ can have identical characteristics (characteristic curves) and identical electrical behavior. In the case of a negative rate of change $dV_{CMT}/dt$, the control voltage $V_0$ is also negative enough to activate the transistors $T_{P1}$ and $T_{P2}$.

Figure 4:
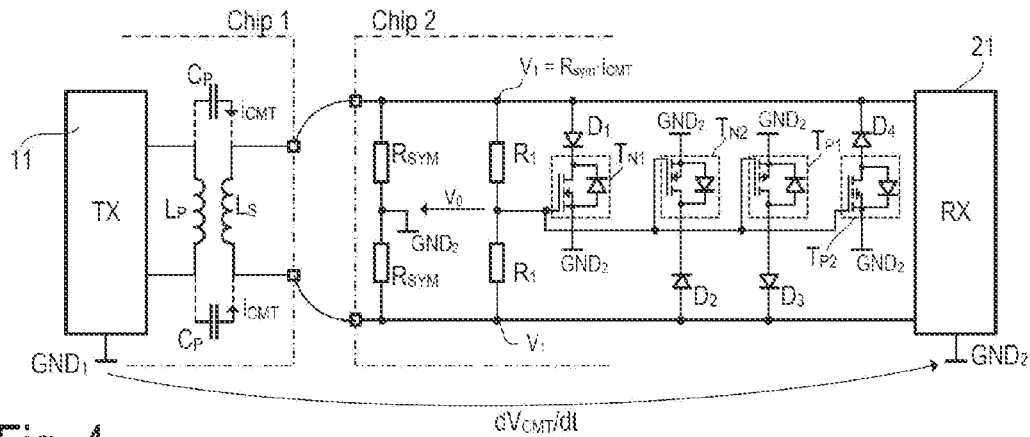
FIG. 4 illustrates a further example, which is a modification of the example from FIG. 3.

The transistors $T_{N1}$, $T_{N2}$, $T_{P1}$, and $T_{P2}$ of the active circuit are implemented as MOS field effect transistors (MOSFETs) in the examples described here. MOSFETs usually comprise an intrinsic body diode connected in parallel with the MOS channel (i.e. in parallel with the load current path) of the respective transistor. In the case of n-channel transistors, the source electrode is to the anode of the intrinsic body diode and the drain electrode the cathode of the intrinsic body diode (in the case of p-channel transistors the situation is the other way around). In the example illustrated in FIG. 3, the active circuit does afford protection in the case of transient common mode currents, but the intrinsic body diodes of the transistors $T_{N1}$, $T_{N2}$, $T_{P1}$ and $T_{P2}$ limit the possible voltage swing of a differential signal that is transmitted via the careless transformer to approximately +0.7 V (temperature-dependent), which corresponds to the forward voltage of the body diodes. In order to solve this problem, diodes can be connected in series with the load current paths (i.e. the drain-source current paths) of the transistors $T_{N1}$, $T_{N2}$, $T_{P1}$, and $T_{P2}$, said diodes being connected in antiseries with the intrinsic body diodes. FIG. 4 illustrates such a situation.

The example illustrated in FIG. 4 is identical to the example from FIG. 3 apart from the diodes $D_1$, $D_2$, $D_3$ and $D_4$ are arranged in series with the load current paths of the transistors $T_{N1}$, $T_{N2}$, $T_{P1}$ and $T_{P2}$, respectively. With the transistors switched off, the diodes $D_1$, $D_2$, $D_3$ and $D_4$ are in antiseries with the respective body diodes. The intrinsic body diodes of the transistors $T_{N1}$, $T_{N2}$, $T_{P1}$ and $T_{P2}$ are explicitly illustrated in FIG. 4. In the other figures the intrinsic body diodes have been omitted for the sake of simplicity, but they are nevertheless present.

Figure 5:
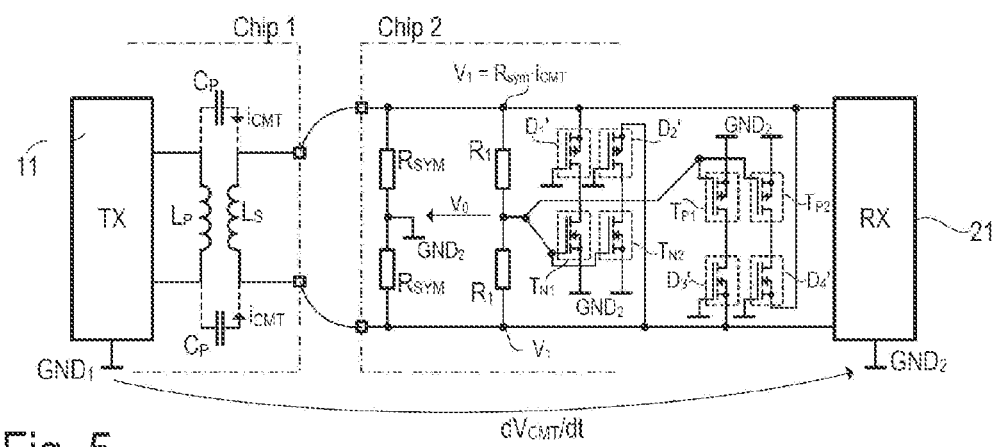
FIG. 5 illustrates an alternative implementation to the example from FIG. 4.

In the example illustrated in FIG. 4, the diodes $D_1$, $D_2$, $D_3$ and $D_4$ are realized by means of pn junctions, i.e. they are customary silicon diodes (if silicon is used as the semiconductor substrate). Alternatively, the diodes can also be implemented as MOS diodes. This situation is illustrated in FIG. 5, in which the MOS transistors connected as "MOS diodes" are designated by $D_1'$, $D_2'$, $D_3'$, and $D_4'$. The transistors $D_1'$ and $D_2'$ operated as diodes are p-channel MOSFETs and the transistors $D_3'$ and $D_4'$ are n-channel MOSFETs. The gate electrodes of the transistors $D_4'$, $D_2'$, $D_3'$ and $D_4'$ are connected to a constant electrical potential, to the ground node $GND_2$ in the present example. The intrinsic body diodes of the transistors are not illustrated in FIG. 5 for the sake of simplicity, but are nevertheless present. In this example, the intrinsic body diodes of the series-connected transistors $T_{N1}$ and $D_1'$ (and also $T_{N2}$ and $D_2'$, etc.) are not connected in antiseries. The circuit from FIG. 5 thus has the same problem as the circuit from FIG. 3, but the possible voltage swing of a differential signal transmitted via the careless transformer is not limited to approximately ±0.7 V, but rather to approximately ±1.4 V, double the value, which is sufficient for many applications.

Figure 6:
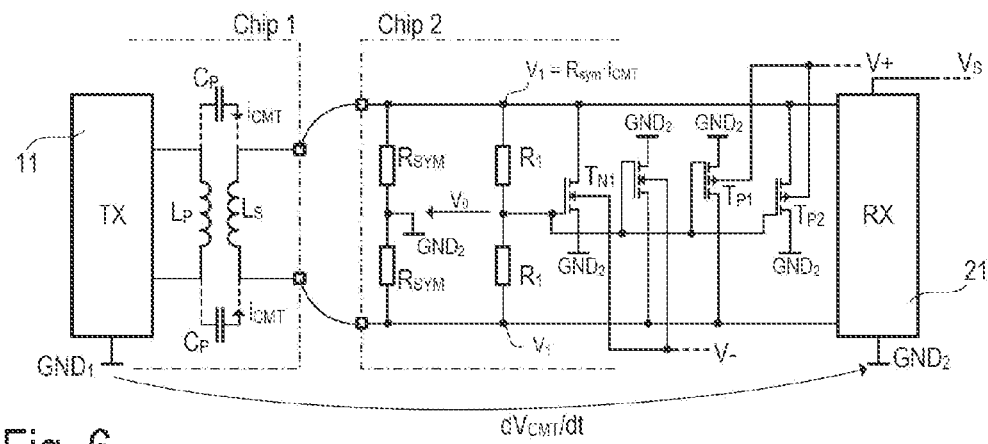
FIG. 6 illustrates a further alternative to the example from FIG. 4.

FIG. 6 illustrates a further example, which can be regarded as an alternative to the example from FIG. 4. In order to avoid the abovementioned limitation of the voltage swing of a differential signal, the body terminals (also called bulk terminals) of the transistors $T_{N1}$, $T_{N2}$, $T_{P1}$ and $T_{P2}$ can also be connected to a circuit node with a constant reference voltage. In the example from FIG. 6, said constant reference voltage is designated by V− for the n-channel transistors $T_{N1}$ and $T_{N2}$ and by V+ for the p-channel transistors $T_{P1}$ and $T_{P2}$. In contrast thereto, in the example from FIG. 4, the bulk terminals of the transistors are directly connected to the source electrode of the respective transistor. In the example from FIG. 6, the reference voltage V− is negative in relation to ground $GND_2$, and the reference voltage V+ is positive and higher than the supply voltage Vs of the receiver circuit 21. The reference voltages V+ and V− can be provided for example by means of techniques known per se such as e.g. charge pumps on the basis of the supply voltage Vs.

Figure 7:
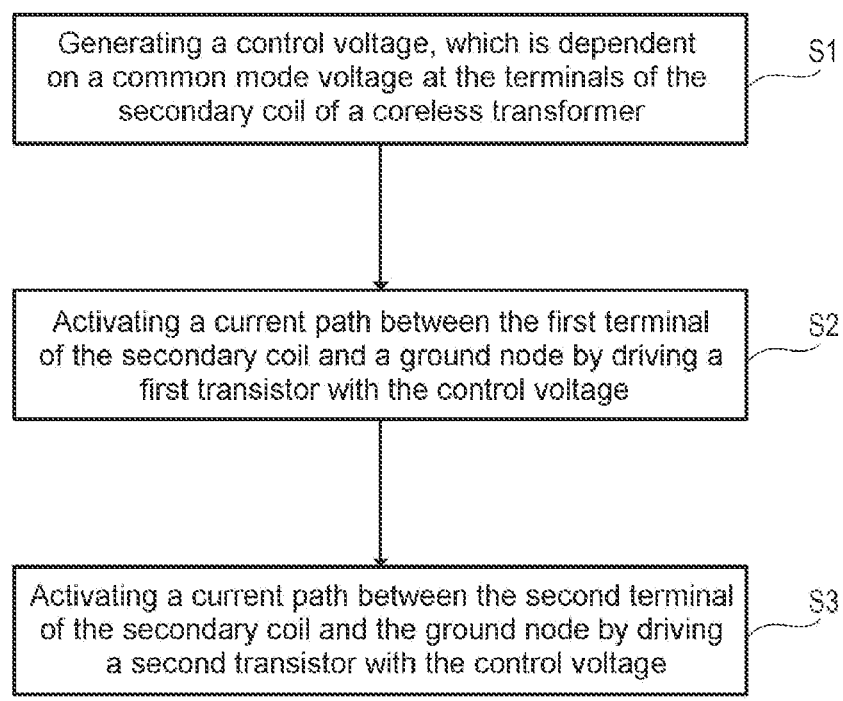
FIG. 7 is a flow diagram for illustrating one example of a method which can be implemented by the active circuit in FIG. 3.

The function of the exemplary embodiments from FIGS. 3-6 is summarized below. It goes without saying that the following explanation is not a complete enumeration of the functions provided by the exemplary embodiments, rather a few important aspects are summarized merely by way of example. FIG. 7 is a flow diagram of a method that can be implemented by the active circuits from FIGS. 3-6.

The exemplary embodiments described here essentially implement a method for transmitting differential signals via a coreless transformer having a primary coil (see e.g. FIGS. 3-6, primary coil $L_P$) and a secondary coil $L_S$ (see e.g. FIGS. 3-6, secondary coil $L_S$). A voltage divider (see e.g. FIGS. 3-6, voltage divider having two resistors $R_{sym}$) is connected between the first terminal and the second terminal of the secondary coil, and a center tap of the voltage divider is connected to a ground node (see e.g. FIGS. 3-6, $GND_2$ denotes the ground of the electronics on the secondary side). In accordance with FIG. 7, the method comprises generating a control voltage (see FIG. 7, step S1), which is dependent on a common mode voltage at the first terminal and the second terminal of the secondary coil (cf. FIG. 3, common mode voltage $V_1$). The method furthermore comprises activating a current path between the first terminal of the secondary coil and the aforementioned ground node by driving a first transistor with the control voltage (see FIG. 7, step S2). For this purpose, a load current path of the first transistor couples the first terminal of the secondary coil to the ground node. The method furthermore comprises activating a current path between the second terminal of the secondary coil and the ground node by driving a second transistor with the control voltage (see FIG. 7, step S3). For this purpose, a load current path of the second transistor couples the second terminal of the secondary coil to the ground node (see FIGS. 3-6, transistors $T_{N1}$ and $T_{N2}$).

It goes without saying that the functions provided by the exemplary embodiments described here can be implemented in many different ways. Therefore, the concrete circuits shown in the figures should be understood merely as examples. Depending on the actual application, the circuits may also be constructed more complexly and comprise additional components. It goes without saying that circuit parts known per se which are not necessary for explaining the function (for example the charge pumps mentioned in relation to FIG. 6, customary voltage supply circuits, etc.) have been omitted in order not to complicate the description unnecessarily.

The invention claimed is:

1. A circuit arrangement comprising:
a primary coil and a secondary coil, which are inductively coupled, but galvanically isolated from one another;
a first voltage divider comprising a first terminal, a second terminal, and a center tap, the first terminal of the first voltage divider being connected to a first terminal of the secondary coil and the second terminal of the first voltage divider being connected to a second terminal of the secondary coil, and the center tap of the first voltage divider being connected to a ground node;
a second voltage divider comprising a first terminal, a second terminal, and a center tap, the first terminal of the second voltage divider being connected to a first terminal of the secondary coil and the second terminal of the second voltage divider being connected to a second terminal of the secondary coil;
an active circuit, which is connected to the first terminal of the secondary coil, the second terminal of the secondary coil, the center tap of the second voltage divider, and to the ground node; and
wherein the active circuit is configured to provide a current path between the first terminal of the secondary coil and the ground node and between the second terminal of the secondary coil and the ground node depending on voltage at the center tap of the second voltage divider.

2. The circuit arrangement according to claim 1, wherein the first voltage divider comprises two identical resistors.

3. The circuit arrangement according to claim 1, wherein the second voltage divider comprises two identical resistors.

4. The circuit arrangement according to claim 1, wherein the active circuit comprises:
a first transistor including a first load current path connecting the first terminal of the secondary coil and the ground node,
a second transistor including a second load current path connecting the second terminal of the secondary coil and the ground node, and
wherein a control electrode of the first transistor and a control electrode of the second transistor are coupled to the center tap of the second voltage divider.

5. The circuit arrangement according to claim 4, wherein the first transistor and the second transistor comprise the same transistor type.

6. The circuit arrangement according to claim 4, wherein the active circuit further comprises:
a third transistor including a third load current path connecting the first terminal of the secondary coil and the ground node,
a fourth transistor including a fourth load current path connecting the second terminal of the secondary coil and the ground node, and
wherein a control electrode of the third transistor and a control electrode of the fourth transistor are coupled to the center tap of the second voltage divider.

7. The circuit arrangement according to claim 6, wherein the first transistor and the second transistor comprise the same transistor type.

8. The circuit arrangement according to claim 6, wherein the first transistor and the second transistor are each of a first transistor type and the third transistor and the fourth transistor are each of a second transistor type, wherein the first transistor type is complementary to the first transistor type.

9. The circuit arrangement according to claim 6, wherein the first load current path of the first transistor, the second load current path of the second transistor, the third load current path of the third transistor, and the fourth load current path of the third transistor are each connected in series with a respective diode.

10. The circuit arrangement according to claim 9, wherein the respective diodes are implemented as metal-oxide-semiconductor diodes.

11. The circuit arrangement according to claim 4, wherein the first load current path of the first transistor, the second load current path of the second transistor, the third load current path of the third transistor, and the fourth load current path of the third transistor are each connected in series with a respective load current path of a respective further transistor.

12. The circuit arrangement according to claim 11, wherein the respective further transistors are embodied as metal-oxide-semiconductor field effect transistors, the gate electrode of which are coupled to the ground node.

13. The circuit arrangement according to claim 4, wherein the first transistor and the second transistor each comprise a bulk terminal connected to a constant first voltage.

14. The circuit arrangement according to claim 6, wherein the third transistor and the fourth transistor each comprise a bulk terminal connected to a constant second potential, which is higher than at the ground node potential.

15. The circuit arrangement according to claim 1, further comprising:
a transmitter circuit configured to drive the primary coil, wherein the transmitter circuit is arranged in a first semiconductor chip, and wherein the active circuit is arranged in a second semiconductor chip, and wherein both the first semiconductor chip and the second semiconductor chip are arranged in the same chip package.

16. A semiconductor component comprising:
a chip package including a first semiconductor chip and a second semiconductor chip; and
a circuit arrangement comprising:
a primary coil and a secondary coil, which are inductively coupled, but galvanically isolated from one another;

a first voltage divider comprising a first terminal, a second terminal, and a center tap, the first terminal of the first voltage divider being connected to a first terminal of the secondary coil and the second terminal of the first voltage divider being connected to a second terminal of the secondary coil, and the center tap of the first voltage divider being connected to a ground node;

a second voltage divider comprising a first terminal, a second terminal, and a center tap, the first terminal of the second voltage divider which is being connected to a first terminal of the secondary coil and the second terminal of the second voltage divider being connected to a second terminal of the secondary coil;

an active circuit, which is connected to the first terminal of the secondary coil, the second terminal of the secondary coil, the center tap of the second voltage divider, and to the ground node; and wherein the active circuit is configured to provide a current path between the first terminal of the secondary coil and the ground node and between the second terminal of the secondary coil and the ground node depending on voltage at the center tap of the second voltage divider, and wherein the primary coil and the secondary coil are integrated in metallization layers of the first semiconductor chip, and wherein the first voltage divider, the second voltage divider and the active circuit are integrated in the second semiconductor chip.

17. The semiconductor component according to claim 16, wherein the first terminal of the secondary coil and the second terminal of the secondary coil are each connected to the second semiconductor chip via a bond wire.

18. A method for transmitting differential signals via a primary coil and a secondary coil, the method comprising:

generating a control voltage, which is dependent on a common mode voltage between a first terminal of the secondary coil and a second terminal of the secondary coil, using a first voltage divider and a second voltage divider, wherein the first voltage divider comprises a first terminal connected to a first terminal of the secondary coil, a second terminal connected to the second terminal of the secondary coil, and a center tap connected to a ground node and wherein the second voltage divider comprises a first terminal connected to the first terminal of the secondary coil, a second terminal connected to the second terminal of the secondary coil;

activating a first load current path between the first terminal of the secondary coil and the ground node by driving a first transistor with the control voltage, wherein the first load current path of the first transistor couples the first terminal of the secondary coil to the ground node; and activating a second load current path between the second terminal of the secondary coil and the ground node by driving a second transistor with the control voltage, wherein the second load current path of the second transistor couples the second terminal of the secondary coil to the ground node.

19. The circuit arrangement according to claim 1, wherein the primary coil and the secondary coil form a coreless transformer.

20. The circuit arrangement according to claim 1, wherein the secondary coil does not include a center tap.

* * * * *